(12) United States Patent
Yu et al.

(10) Patent No.: US 6,343,017 B1
(45) Date of Patent: Jan. 29, 2002

(54) HEAT SINK ASSEMBLY

(75) Inventors: Hung-Chi Yu, Hsi-Chih (TW); Atsushi Yoneyama, Nagano (JP)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/751,804

(22) Filed: Dec. 29, 2000

(51) Int. Cl.$^7$ .................................................. H05K 7/20
(52) U.S. Cl. ....................... 361/704; 361/690; 361/694; 361/719; 174/16.3; 165/80.3; 757/718; 757/719; 757/727; 757/722; 24/458; 24/520
(58) Field of Search ................................. 361/702–704, 361/707, 709, 690, 694, 695, 717–719; 165/80.3, 185; 257/706, 707, 712, 713, 717–719, 722, 727; 174/16.3; 248/316.7, 510; 24/458, 520

(56) References Cited

U.S. PATENT DOCUMENTS

| | | | | |
|---|---|---|---|---|
| 5,287,249 A | * | 2/1994 | Chen | 361/718 |
| 5,323,845 A | * | 6/1994 | Kin-shon | 165/80.3 |
| 5,493,475 A | * | 2/1996 | Lin | 361/710 |
| 6,193,205 B1 | * | 2/2001 | Wang | 248/510 |
| 6,205,026 B1 | * | 3/2001 | Wong et al. | 361/704 |

\* cited by examiner

*Primary Examiner*—Gerald Tolin
*Assistant Examiner*—Boris L. Chervinsky
(74) *Attorney, Agent, or Firm*—Wei Te Chung

(57) ABSTRACT

A heat sink assembly for use with an electronic IC chip (4) includes a socket (30), a heat sink (2), a pair of mounting clips (32) and a pair of retention modules (31). The heat sink abuts against the chip and has a plurality of cooling fins (21) extending upwardly from a base (20) and a pair of securing flanges (22) extending outwardly from the base. Each retention module defines a protrusion (313) on a first sidewall (311) and a latch (314) on a second sidewall (312). Each mounting clip forms a base member (320) defining two apertures (327) for receiving the protrusions. An arm (321) with a notch (325) defined on a free end thereof is formed at either lateral end of the base member for engaging with the latches. A retaining clip (322) extends downwardly and inwardly from the mounting clip for pressing against the securing flange.

10 Claims, 5 Drawing Sheets

HEAT SINK ASSEMBLY

BACKGROUND OF THE INVENTION

1. Field of the Invention

The present invention relates to a heat sink assembly, and particularly to a heat sink assembly used to cool a chip unit on a socket.

2. Description of Prior Art

Heat produced by an electronic chip unit during operation needs to be timely dissipated to ensure proper operation of the chip unit. To achieve this, a heat sink assembly is generally used. U.S. Pat. No. 5,671,118 discloses a socket forming two opposite claws, a chip unit mounted on the socket, a heat sink positioned on the chip unit, and a two piece clip having two end portions respectively engaging with the claws and a spring section pressing the heat sink against the chip unit. The clip ensures good thermal connection between the chip unit and the heat sink, promoting conduction of the heat generated by the chip unit away via the heat sink.

However, the connection between the prior art clip and the socket is not secure; thus, when subjected to vibration or shock, the clip may separate from the socket, which will allow the heat sink to lose intimate engagement with the chip unit, decreasing the rate of dissipation of the heat generated by the chip unit. Hence, an improved heat sink assembly is required to overcome the disadvantages of the conventional heat sink assembly.

SUMMARY OF THE INVENTION

Accordingly, an object of the present invention is to provide a heat sink assembly having clips which can be securely fixed to a socket so that an intimate engagement between a chip and a heat sink can always be ensured even when the heat sink assembly is subjected to vibration or shock.

In order to achieve the objects set forth, a heat sink assembly for use with an electronic integrated circuit chip includes a heat sink, a socket, a pair of retention modules and a pair of mounting clips. The heat sink includes a horizontal base and a plurality of cooling fins upwardly extending therefrom. A pair of securing flanges extends outwardly beside the fins. The retention modules are mounted at two opposite sides of the socket and each defines a protrusion on each of two opposite first sidewalls thereof, and a latch on a second sidewall connecting the first sidewalls together. Each mounting clip defines an elongate base member and a pair of arms extending perpendicularly from each lateral end of the base member and to a same side. The base member defines at least a pair of apertures on the lateral ends for receiving the protrusions. A notch is defined on a free end of each arm for engaging with a corresponding latch.

Other objects, advantages and novel features of the invention will become more apparent from the following detailed description when taken in conjunction with the accompanying drawings.

DETAILED DESCRIPTION OF THE INVENTION

Figure 1:
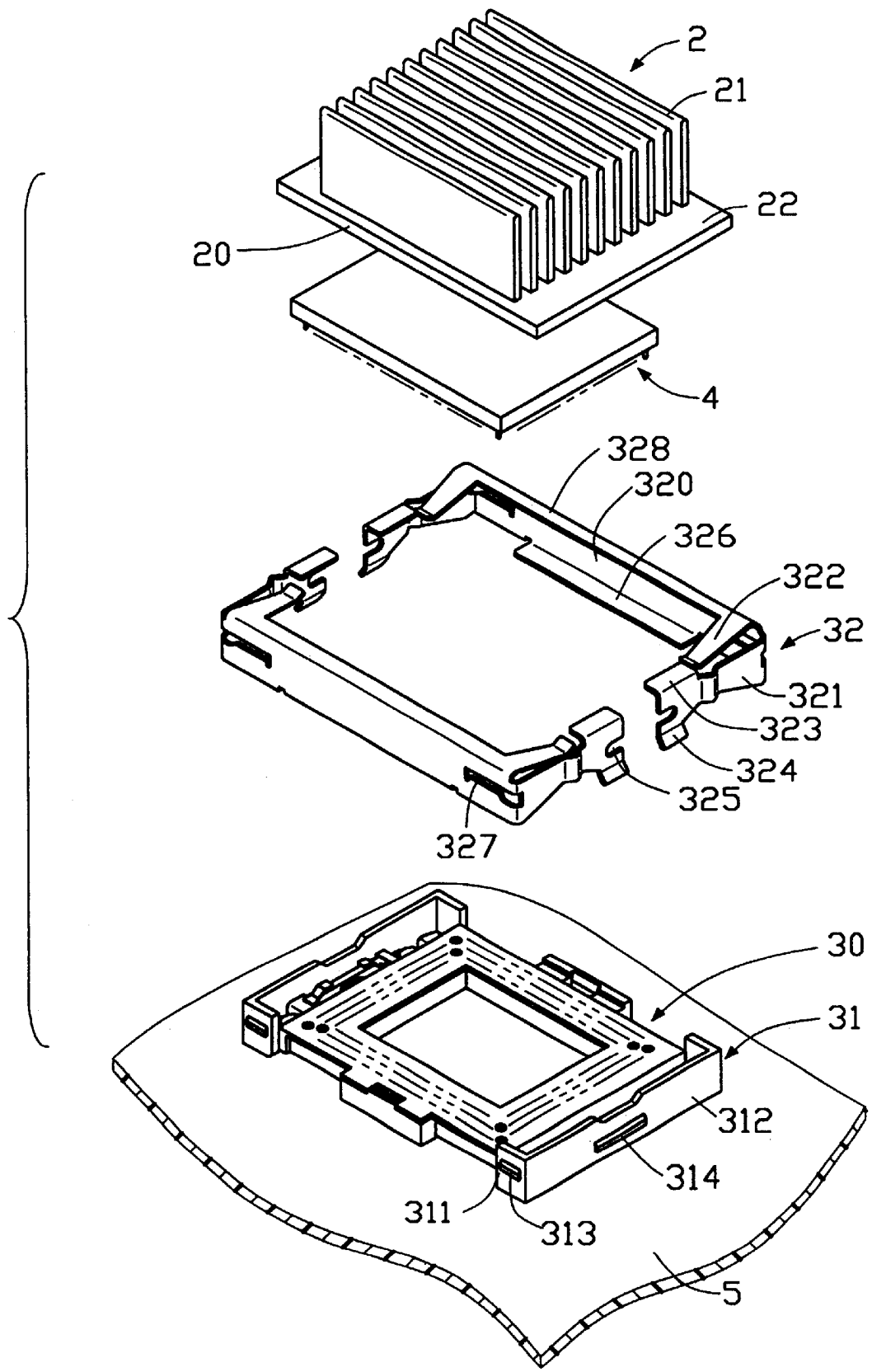
FIG. 1 is an exploded perspective view of a heat sink assembly in accordance with the a first embodiment of the present invention, with a chip, a socket, and a printed circuit board.
Figure 2:
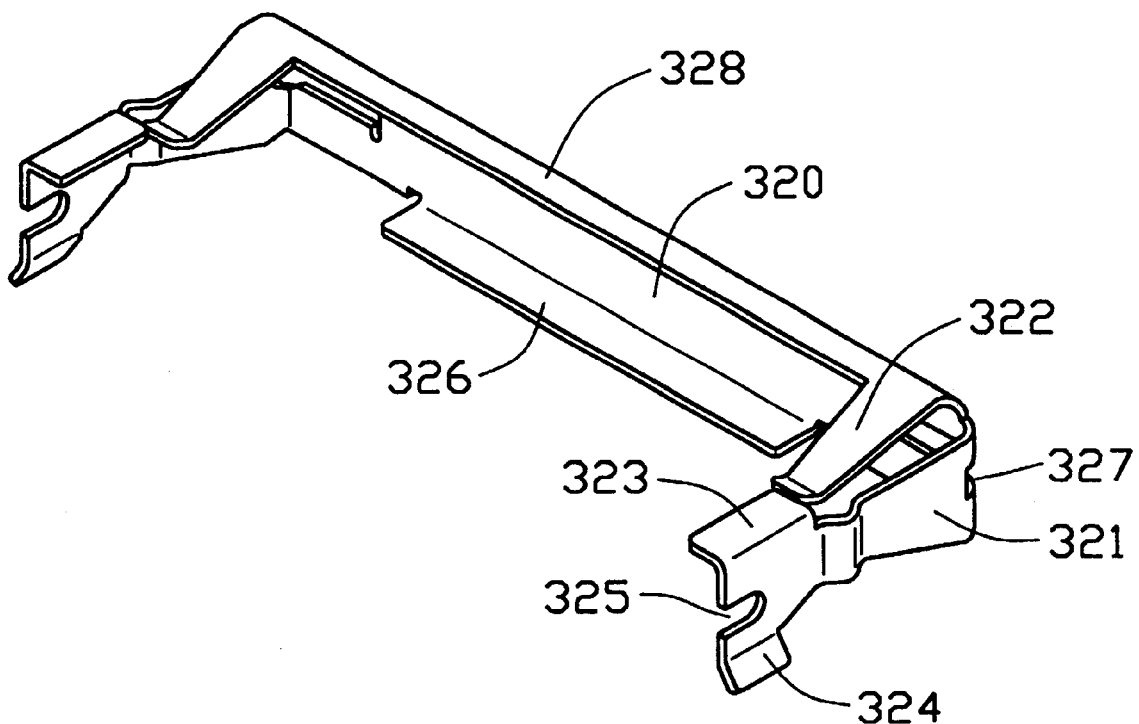
FIG. 2 is a perspective view of a clip of the heat sink assembly of FIG. 1.

Reference will now be made to the drawing figures to describe the present invention in detail.

Referring to FIG. 1, a heat sink assembly for use with an electronic integrated circuit chip 4 includes a heat sink 2, a socket 30, a pair of mounting clips 32 and a pair of retention modules 31. The heat sink 2 includes a thermally conductive base 20 and a plurality of thermally conductive cooling fins 21 upwardly extending from the base 20. A pair of securing flanges 22 outwardly extend at the sides of the base 20 beside the cooling fins 21.

The socket 30 is used for electrically connecting the chip 4 to a printed circuit board 5, such as a mother board, and is well known by those skilled in the art. Therefore, a detailed description of the socket 30 is omitted herein.

The retention modules 31 are mounted at two lateral sides of the socket 30. Each retention module 31 forms a pair of outwardly extending protrusions 313 on first sidewalls 311 and an outwardly extending latch 314 on a second sidewall 312 connecting the two first sidewalls 311 together.

Each mounting clip 32 comprises an elongate base member 320 with two laterally extending arms 321 projecting perpendicularly from either end thereof. The base member 320 defines an aperture 327 on each end thereof. A mounting flange 326 projects perpendicularly and inwardly from a lower edge of the base member 320. An upper flange 328 extends perpendicularly and inwardly from an upper edge of the base member 320. A retaining clip 322 extends downwardly and inwardly from either lateral end of the upper flange 328. A handle 323 extends horizontally and inwardly from an upper edge of a free end of the arm 321. A tongue 324 extends downwardly and outwardly from a lower edge of the free end of the arm 321 to facilitate fixing the mounting clip 32 to the retention module 31. A notch 325 is defined in the free end of the arm 321.

Figure 3:
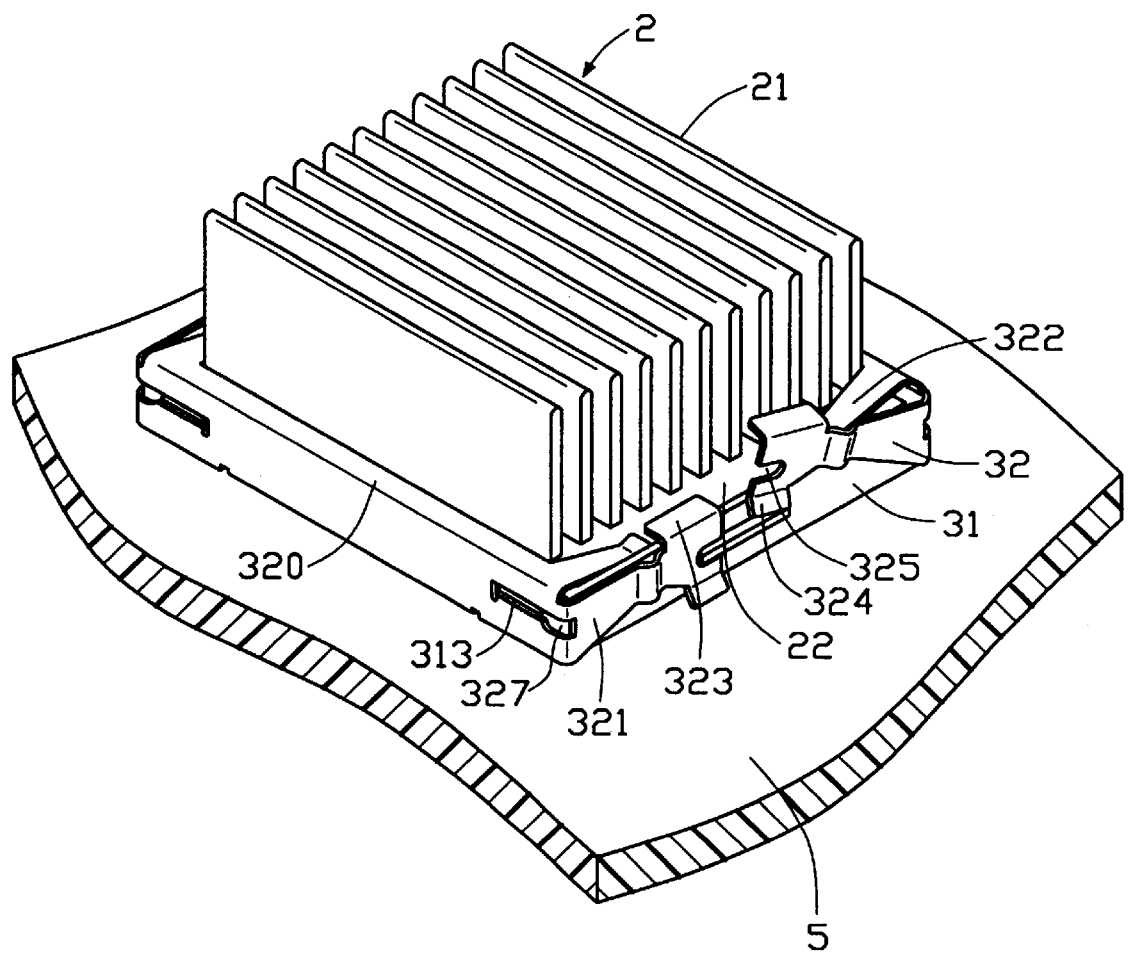
FIG. 3 is a perspective view of the heat sink assembly of FIG. 1 in a partially assembled state.
Figure 4:
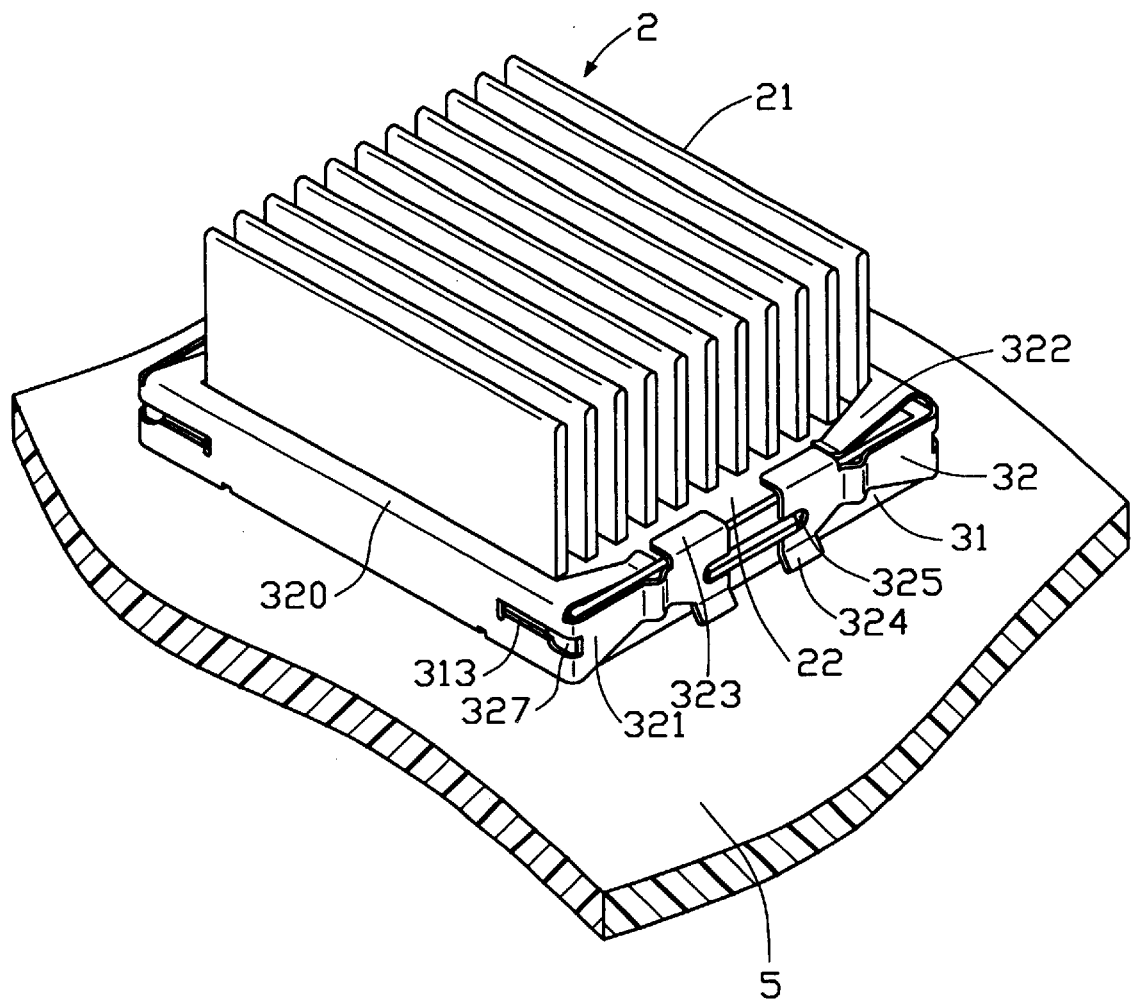
FIG. 4 is a perspective view of the assembled heat sink assembly of FIG. 1.

In assembly, referring to FIG. 3 and FIG. 4, after the socket 30 and retention modules 31 are assembled to the printed circuit board 5, the chip 4 is assembled to the socket 30. Then the heat sink 2 is placed on the chip 4 with each securing flange 22 located between the first sidewalls 311 and the second sidewall 312 of a corresponding retention module 31. The mounting clips 32 are assembled to the socket 30 and retention modules 31 from opposite sides of the socket 30. The mounting flanges 326 are inserted in a gap between the socket 30 and the printed circuit board 5 with the protrusions 313 being received in the apertures 327. At this time the retaining clips 322 press against the securing flanges 22 of the heat sink 2, and inner faces (not labeled) of the tongues 324 contact with upper faces of the latches 314. The handles 323 are then pressed down and the tongues 324 move downward over the latches 314. The tongues 324 deform outwardly until they resiliently snap inward as each latch 314 engages with a corresponding notch 325. The forces provided by the securing flanges 326 upward against the socket 30 and by the retaining clips 322 downward against the securing flanges 22 securely retain the heat sink 2 against the chip 4 and between the retention modules 31.

As the securing flanges 22 are located to the sides of the chip 4, there is more space to form the cooling fins 21, increasing the heat dissipating capacity of the heat sink assembly over that of the prior art. The heat sink assembly dissipates heat more efficiently than that of the prior art.

Figure 5:
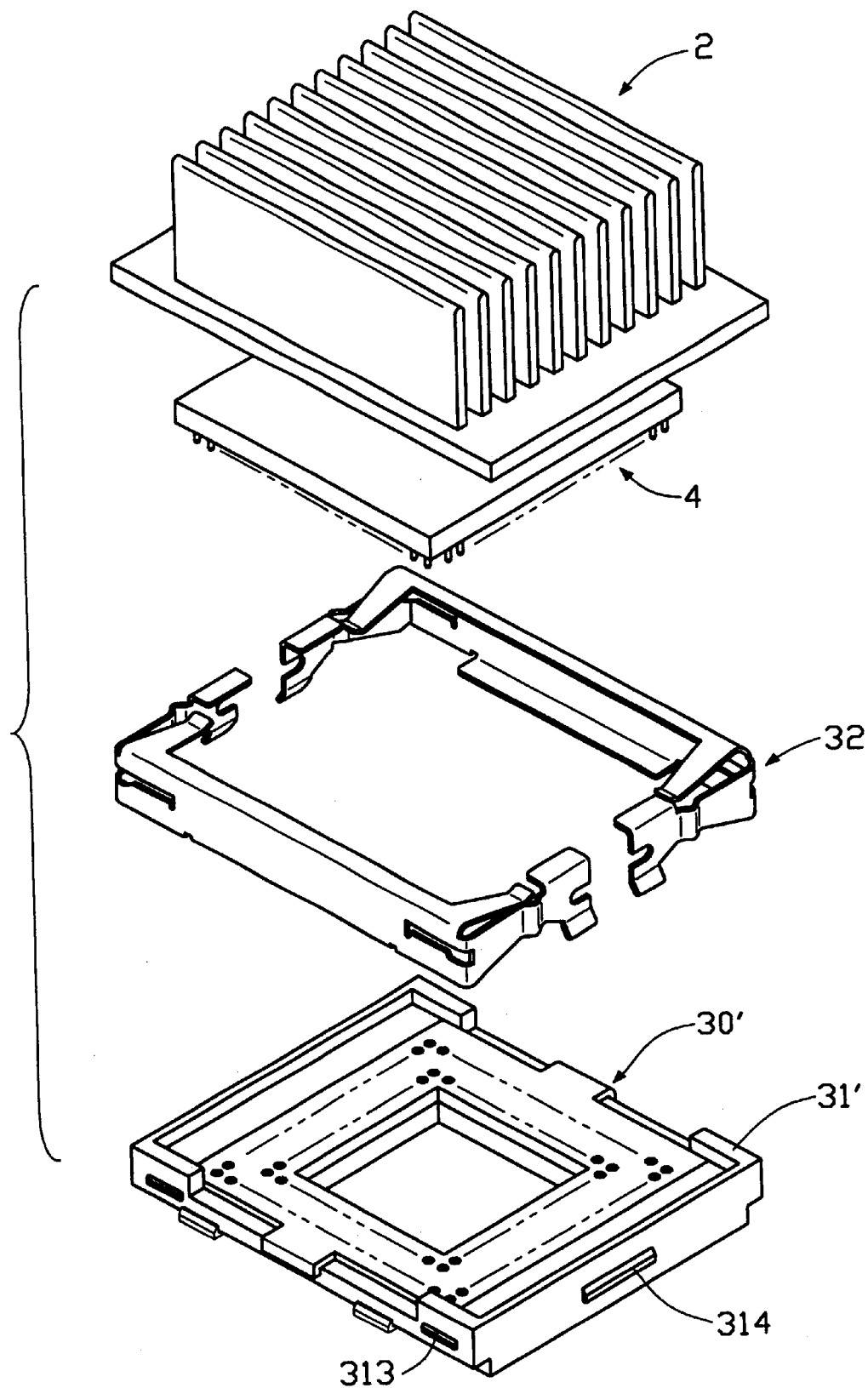
FIG. 5 is an exploded perspective view of a heat sink assembly in accordance with a second embodiment of the present invention, with a chip.

Referring to FIG. 5, in a second embodiment, two retention portions 31' are integrally formed with a socket 30'. The latches 314 and the projections 313 are formed on the retention portions 31'. The socket 30' with the integral retention portions 31' is assembled to the printed circuit board 5. The chip 4, the heat sink 2, and the mounting clips 32 are then assembled in the same way as in the first embodiment. The second embodiment has the advantages of a smaller number of components with a simplified mounting procedure.

One feature of the invention is to provide the heat sink mounting clip to surround the socket rather than traditionally vertically mounting on one line section of the socket, thus resulting in not only the fastening function between the heat sink and the socket/retention module, but also the shielding function to the socket circumferentially.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly adapted for dissipating heat generated during operation of an integrated circuit chip, comprising:

a rectangular socket on which the chip is mounted;

a pair of retention modules located at two opposite sides of the socket, each retention module comprising at least a protrusion on two opposite first sidewalls, and a latch on a second sidewall between the first sidewalls;

a heat sink abutting an upper surface of the chip;

at least a mounting clip defining an elongate base member and a pair of arms extending perpendicularly from each lateral end of the base member and to a same side of the base member, the base member defining at least a pair of apertures on the lateral ends for receiving the protrusions of opposite retention modules, a notch being defined on a free end of each arm for engaging with a corresponding latch.

2. The heat sink assembly as described in claim 1, wherein the heat sink has a horizontal base, a plurality of cooling fins upwardly extending from the base and a securing flange horizontally extending from the base and located beside the fins.

3. The heat sink assembly as described in claim 1, wherein a handle extends horizontally from an upper edge of the free end of each arm.

4. The heat sink assembly as described in claim 1, wherein a tongue extends downwardly and outwardly from a lower edge of the free end of each arm.

5. The heat sink assembly as described in claim 1, wherein a mounting flange extends perpendicularly from a lower edge of the base member and to the same side to which the arms extend.

6. A heat sink assembly adapted for dissipating heat generated during operation of an integrated circuit chip, comprising:

a rectangular socket on which the chip is mounted, the socket comprising at least a retention portion on a lateral side thereof, a protrusion on each of two opposite first sidewalls of the retention portion, and a latch on a second sidewall between the first sidewalls;

a heat sink abutting against the chip;

at least a clip defining an elongate base member and an arm on each lateral end thereof, the base member defining an aperture on each of two lateral ends for receiving at least a protrusion, a notch being defined on a free end of each arm for engaging with at least a latch.

7. The heat sink assembly as described in claim 6, wherein the heat sink has a horizontal base, a plurality of cooling fins upwardly extending from the base and a securing flange horizontally extending from the base and located beside the fins.

8. The heat sink assembly as described in claim 6, wherein a handle extends horizontally from an upper edge of the free end of each arm.

9. The heat sink assembly as described in claim 6, wherein a tongue extends downwardly and outwardly from a lower edge of the free end of each arm.

10. The heat sink assembly as described in claim 6, wherein a mounting flange extends perpendicularly from a lower edge of the base member and to the same side to which the arms extend.

* * * * *